(12) United States Patent
Kikuchi et al.

(10) Patent No.: US 6,717,494 B2
(45) Date of Patent: Apr. 6, 2004

(54) PRINTED-CIRCUIT BOARD, COAXIAL CABLE, AND ELECTRONIC DEVICE

(75) Inventors: Hideo Kikuchi, Tokyo (JP); Toshiyuki Kaneko, Tokyo (JP); Hideki Kikuchi, Tokyo (JP); Kazuhiro Kinoshita, Tokyo (JP); Kiyohiko Kaiya, Tokyo (JP); Yutaka Akimoto, Tokyo (JP)

(73) Assignee: NEC Toppan Circuit Solutions, Inc., Tokyo (JP)

( * ) Notice: Subject to any disclaimer, the term of this patent is extended or adjusted under 35 U.S.C. 154(b) by 51 days.

(21) Appl. No.: 10/101,098

(22) Filed: Mar. 20, 2002

(65) Prior Publication Data

US 2003/0021097 A1 Jan. 30, 2003

(30) Foreign Application Priority Data

Jun. 21, 2001 (JP) ........................................ 2001-188912

(51) Int. Cl.⁷ ................. H01P 3/06; H01P 3/08
(52) U.S. Cl. ................. 333/243; 333/246; 333/185
(58) Field of Search ................. 333/185, 243, 333/245, 246, 247

(56) References Cited

U.S. PATENT DOCUMENTS

| 4,743,874 A | * | 5/1988 | Kinoshita et al. ........ 333/219.2 |
| 5,138,436 A | * | 8/1992 | Koepf ........................ 257/728 |
| 5,587,887 A | * | 12/1996 | Price et al. ................. 361/794 |
| 6,312,281 B1 | * | 11/2001 | Rodriguez ................. 439/394 |

FOREIGN PATENT DOCUMENTS

| JP | 10-190237 | 7/1998 | ............ H05K/3/46 |
| JP | 2002-185091 | * 6/2002 | ............ H05K/1/02 |

* cited by examiner

*Primary Examiner*—Robert Pascal
*Assistant Examiner*—Dean Takaoka
(74) *Attorney, Agent, or Firm*—McGinn & Gibb, PLLC

(57) ABSTRACT

Occurrence of EMI is reduced without a sharp increase of the manufacturing cost by suppressing a common mode current stably. There is provided a disclosed printed-circuit board being adapted such that a width of an outer edge section of a T-shaped pattern is widened so as to surround a recessed section with a frame-shaped additional electric conductor by electrically connecting the frame-shaped additional electric conductor with the T-shaped pattern making up a ground pattern so as to close the recessed section.

23 Claims, 12 Drawing Sheets

PRINTED-CIRCUIT BOARD, COAXIAL CABLE, AND ELECTRONIC DEVICE

BACKGROUND OF THE INVENTION

1. Field of the Invention

The present invention relates to a printed-circuit board, a coaxial cable, and an electronic device, and more specifically to those capable of reducing electromagnetic interference (EMI) which occurs when a current flows in the same direction in a ground pattern and a power supply pattern, both of which are respectively made up of a wide electric conductor pattern and disposed, opposed to each other.

The present application claims priority of Japanese Patent Application No. 2001-188912 filed on Jun. 21, 2001, which is hereby incorporated by reference.

2. Description of the Related Art

An electronic device including various electronic components such as active elements and passive elements is assembled by packaging desirable electronic components on a printed-circuit board. On the printed-circuit board there are formed a ground pattern for providing reference electric potential to the electronic components and a power supply pattern for supplying electric power by making use of electric conductor patterns. Use is sometimes made of a wide electric conductor pattern as such the ground pattern and the power supply pattern. For example, in a printed-circuit board on which an ordinary integrated circuit is packaged there is known wide electric conductor patterns having longitudinal and lateral width sizes of several centimeters.

In such the printed-circuit board, electromagnetic energy is supplied to the wide electric conductor pattern through terminal resistance during operation of the electronic device. A current is hereby conducted to the wide electric conductor pattern to cause resonance, whereby unnecessary electromagnetic waves (so-called "radiated emission") are radiated from the wide electric conductor pattern to the surroundings.

Radiation of unnecessary electromagnetic waves causes occurrence of EMI, whereby the electronic device is subject to electromagnetic interference.

Occurrence of such EMI is more increased particularly when the wide electric conductor pattern acts as an antenna.

When the ground pattern and the power supply pattern are formed in opposition to each other to permit a current to conduct in the same direction through both patterns, that is to say, a current flows in a same phase through both patterns, both patterns act as if they are a single wide electric conductor pattern, whereby the wide electric conductor pattern acts as an antenna to radiate strong unnecessary electromagnetic waves. Such a current conducted through the wide electric conductor pattern is called a common mode current, and resonance at that time is called a common mode resonance.

Referring here to FIG. 20A the common mode resonance is intensified provided a size of a wide electric conductor pattern 110 in a lateral direction X is set into an elongated configuration. Referring further to FIG. 20B, the common mode resonance is intensified provided the wide electric conductor pattern 110 is formed into a T-shaped pattern by uniting a first electric conductor section 111 and a second electric conductor section 112 both having different longitudinal sizes in a vertical direction Y. Referring furthermore to FIG. 20C, the common mode resonance is intensified when the wide electric conductor pattern 110 is formed into an L-shaped pattern by uniting a first electric conductor section 113 and a second electric conductor section 114 both having different longitudinal sizes in the vertical direction Y.

More specifically, when the wide electric conductor pattern 110 is formed into a pattern configuration having partly a recessed section 115 such as the aforementioned T-shaped pattern or L-shaped pattern for example, the common mode resonance is intensified in particular. Any pattern configuration partly having the recessed section 115 as such is inevitably formed because of limitation to an area of a printed-circuit board on which many electronic components are packaged when the printed-circuit board is manufactured which is then actually assembled into varieties of electronic devices.

Japanese Laid-open Patent Application No. Hei 10-190237 for example discloses a printed-circuit board (first prior art technique) in which EMI occurring owing to the aforementioned common mode current is reduced. FIG. 21A is a plan view illustrating the printed-circuit board, and FIG. 21B is a cross sectional view illustrating the same but viewed in the direction of arrows E—E.

Referring to FIGS. 21A and 21B, a ground pattern 101 and a power supply pattern 102 are formed, opposed to each other, in an insulating layer 103, and a signal wiring layer 104 is formed on the face and back of the insulating layer 103, and further a resistor 105 is provided at an end of the insulating layer 103 such that it is prevented from making any contact with the ground pattern 101 and the power supply pattern 102. The common mode current is suppressed owing to the resistor 105 to reduce the occurrence of EMI.

There are known, as the prior art printed-circuit board, ones where the common mode current is suppressed (a second prior art technique), ones where a high frequency loss material such as rubber ferrite is provided on the ground pattern and the power supply pattern such that it is in close contact with the latters. With the high frequency loss material the common mode current is suppressed to reduce the occurrence of EMI.

However the prior art printed-circuit board described above suffers from the following problems: In the first prior art technique the resistor 105 must be provided at the end of the insulating layer 103 with high accuracy such that it is prevented from making contact with the ground pattern 101 and the power supply pattern 102 thus causing a high manufacturing cost.

In the second prior art technique the material such as rubber ferrite that is the high frequency loss material is likely to be changed in its physical property (magnetic permeability) with the passage of time, so that the operation to suppress the common mode current becomes unstable.

SUMMARY OF THE INVENTION

In view of the above, it is an object of the present invention to provide a printed-circuit board, a coaxial cable, and an electronic device, which are capable of reducing the occurrence of EMI without a severe increase of the manufacturing cost by stably suppressing the common mode current.

According to a first aspect of the present invention, there is provided a printed-circuit board including:

a printed-circuit board including:
 an insulating layer;
 a wide electric conductor pattern formed into a plane configuration having a recessed section in part so as to make up a ground pattern or a power supply pattern on the insulating layer; and an an additional electric conductor electrically connected with the wide electric conductor pattern so as to close the recessed section.

In the foregoing first aspect, a preferable mode is one wherein the wide electric conductor pattern comprises a T-shaped pattern, an L-shaped pattern, or an H-shaped pattern.

Another preferable mode is one wherein the wide electric conductor pattern and the additional electric conductor are formed on different surfaces of the insulating layer respectively.

Still another preferable mode is one wherein the wide electric conductor pattern and the additional electric conductor are electrically connected with each other through a via plug formed on the insulating layer.

Additional preferable mode is one wherein the additional electric conductor is electrically connected with a side surface of the electronic components of the wide electric conductor pattern at a position of packaging of the electronic components.

Further preferable mode is one wherein the additional electric conductor is electrically connected with a side surface of the wide electric conductor pattern on at least one side of the wide electric conductor pattern in a longitudinal direction of the wide electric conductor pattern.

Still further preferable mode is one wherein, the additional electric conductor is formed on the insulating layer simultaneously with the wide electric conductor pattern.

According to a second aspect of the present invention, there is provided a printed-circuit board including:
 an insulating layer;
 a wide electric conductor pattern making up a ground pattern or a power supply pattern;
 a micro-strip line formed through the insulating layer on the wide conductor pattern; and
 an additional electric conductor electrically connected with the wide electric conductor pattern on a side surface of at least one side of the micro-strip line.

According to a third aspect of the present invention, there is provided a coaxial cable including:
 an insulating layer;
 a core line;
 a shield line formed around the core line through the insulating layer; and
 an additional electric conductor electrically connected to at least one side in a length direction of the shield line.

In the foregoing second aspect, a preferable mode is one wherein a longitudinal size D of an outer peripheral edge of the additional electric conductor and a diameter d of the coaxial cable are set to satisfy a relationship: D=6d.

According to a fourth aspect of the present invention, there is provided an electronic device including:
 a printed-circuit board including:
  an insulating layer;
  a wide electric conductor pattern formed into a plane configuration having a recessed section in part so as to make up a ground pattern or a power supply pattern on the insulating layer; and
  an additional electric conductor electrically connected with the wide electric conductor pattern so as to close the recessed section; and
 a coaxial cable including:
  an insulating layer;
  a core line;
  a shield line formed around the core line through the insulating layer; and
  an additional electric conductor electrically connected to at least one side in the length direction of the shield line.

According to a fifth aspect of the present invention, there is provided an electronic device including:
 a printed-circuit board including:
  an insulating layer;
  a wide electric conductor pattern making up a ground pattern or a power supply pattern;
  a micro-strip line formed through the insulating layer on the wide conductor pattern; and
  an additional electric conductor electrically connected with the wide electric conductor pattern on a side surface of at least one side of the micro-strip line.
 a coaxial cable including:
  an insulating layer;
  a core line;
  a shield line formed around the core line through the insulating layer; and
  an additional electric conductor electrically connected to at least one side in the length direction of the shield line.

According to a sixth aspect of the present invention, there is provided an electronic device in which at least one electronic component is mounted on a printed-circuit board wherein a planar wide electric conductor pattern making up a ground pattern or a power supply pattern is formed, the electronic device including:
 an additional electric conductor electrically connected with an outer peripheral edge of the wide electric conductor pattern of a side surface of the electronic components so as to surround a mounted position of the electronic component.

With the above configurations, the additional electric conductor is electronically connected with the wide electric conductor pattern having a recessed section in part thereof so as to close the recessed section for increasing the width of the outer edge section of the wide electric conductor pattern so as to surround the recessed section with the additional electric conductor. Hereby, when the electronic components are packaged on the printed-circuit board, the radiated emission upon the common mode resonance is successfully suppressed.

With configurations of the above coaxial cable, a shield pattern is formed through the insulating layer around the core line, and the width of an outer edge section of the shield pattern is widened so as to surround the shield pattern with the additional electric conductor by electrically connecting the additional electric conductor with at least one side of the shield pattern. Therefore, when the electronic components are packaged on the coaxial cable, the radiated emission in the common mode resonance is successfully suppressed.

With configurations of the above electronic device, it is successfully operated without being influenced by the radiated emission in the common mode resonance because it is assembled with the printed-circuit board of the coaxial cable constructed reduce the radiated emission in the common mode resonance.

Thus, the common mode current is stably suppressed to reduce the occurrence of the EMI without severely increasing the manufacturing cost.

PRINCIPLE OF THE PRESENT INVENTION

In the following, a principle of the present invention will be described, which is an opportunity of the achievement of the present invention.

The inventors associated with the present application performed an experiment and have found the following result. A printed-circuit board is provided on which there is formed a ground pattern or a power supply pattern including respectively a wide electric conductor pattern and a T-shaped pattern. In the printed-circuit board the inventors have found that unnecessary electromagnetic waves radiated from the wide electric conductor pattern are weakened upon common mode resonance by electrically connecting a frame-shaped additional electric conductor to the T-shaped pattern so as to close a recessed section and increasing a width of an external edge section. Accordingly, by electrically connecting the frame-shaped additional electric conductor to the wide electric conductor pattern having the recessed section in part of the T-shaped pattern, or a like, so as to close the recessed section to form the ground pattern or the power supply pattern. The principle of the present invention will be described below based upon an experimental result.

Referring now to FIG. 1A, which is a plan view illustrating a printed-circuit board 1 that includes a T-shaped pattern formed thereon, the printed-circuit board 1 is prepared, in which there are integrated a first electric conductor section 2 and a second electric conductor section 3 to form the T-shaped pattern, the first electric conductor section 2 being of a wide electric conductor pattern which is a rectangle of a size of 80 mm in a lateral direction X and a size of 100 mm in a longitudinal direction Y and the second electric conductor section 3 being of a wide electric conductor pattern which is a rectangle of a size of 60 mm in the lateral direction X and a size of 180 mm in the longitudinal direction Y, and in which a ground pattern 4 including the T-shaped pattern is formed on the surface of an insulating layer 5.

Referring further to FIG. 11, which is a plan view illustrating a printed-circuit board 10 in which a frame-shaped additional electric conductor is electrically connected to the T-shaped pattern so as to close a recessed section 6, the printed-circuit board 10 is prepared, in which the ground pattern 4 including the T-shaped pattern having the same size as that in FIG. 1A is formed on the surface of the insulating layer 5, and a frame-shaped additional electric conductor 7 is electrically connected to the T-shaped pattern of the ground pattern 4 so as to close the recessed section 6. The width size W of the frame-shaped additional electric conductor 7 is set to ⅒ to ¹⁄₂₀₀ (in the present example 140 mm) of the size of the ground pattern 4 in the lateral direction X, the ground pattern 4 including the T-shaped pattern.

Referring furthermore to FIG. 1C, which is a cross sectional view taken along arrows A—A, and in which a power supply pattern 8 is formed facing the ground pattern 4 in the insulating layer 5, and a wiring pattern (signal line) 9 is formed on a face and a back of the insulating layer 5.

As materials for the ground pattern 4, power supply pattern 8, wiring pattern, or a like, use is made of metals such as copper(Cu), aluminum (Al), and iron (Fe). As the insulating layer 5 use is made of an organic insulating board including epoxy resin and an inorganic insulating board including ceramics, or a like Following is the T-shaped pattern (hereinafter, referred to as a wide electric conductor pattern.) that constitutes the ground pattern 4 described above with reference to FIGS. 1A, 1B and 1C. First, reviewing a common mode resonance where the size L in a lateral direction X is taken as a half wavelength, it is found from Maxwell equations that although a common mode current I flowing in the lateral direction flows, substantially half a common mode current I is concentrated in a region of substantially 15% of a distance extending from a electric conductor end up to a position of a center of the electric conductor in the longitudinal direction Y. The substantially half common mode current I flows in a vicinity of a contour line of the wide electric conductor pattern in such a fashion, so that the length of the contour line of the wide electric conductor pattern presents sharp influence on the common mode resonance.

Mounting of electronic components packaged on the wide electric conductor pattern causes an electric potential difference of high frequency to happen between the power supply terminal (not shown) and a ground terminal (not shown) to conduct a high frequency current, when electronic components generate a high speed pulse signal. Waves of current pattern reach a whole of the wide electric conductor pattern around the position of the electronic components. Current waves transmitted as such are reflected on a peripheral edge of the wide electric conductor pattern to cause a resonance current in the wide electric conductor pattern and hence cause the common mode resonance.

Provided there is formed a first electric conductor section 2 having narrow width as in the T-shaped pattern that constitutes the ground pattern 4, the common mode resonance is increased to radiate more radiation noise, that is radiated emission. The electronic components are packaged substantially at a center of the ground pattern 4 of the printed-circuit board 1, and the power supply terminal thereof and the ground terminal thereof are arranged in left and right directions.

Radiation electric power P1 obtained in this situation is more increased than in radiation electric power P2 where electronic components are packaged on the wide electric conductor pattern that forms an infinite plane. The radiation electric power P1 is computed with an electromagnetic simulation, and a radiation ratio P1/P2 is calculated by dividing the radiation electric power P1 by the radiation electric power P2 to demonstrate a characteristic curve B in FIG. 2, which illustrates a relationship between the radiation ratio (longitudinal axis) and frequencies (lateral axis), that is to say, frequency dependency of the radiation ratio.

As shown in FIG. 2, the radiation ratio is maximum at the frequency of 800 MHz, and the electronic components packaged on the printed-circuit board 1 generate radiated emission of about four times that of the electronic components packaged on the infinite plane wide electric conductor pattern.

In contrast, there are compared the radiation electric power P1 upon the electronic components being packaged on the printed-circuit board 10 illustrated in FIG. 1B and the radiation electric power P2 upon the electronic components being packaged on the wide electric conductor pattern that forms an infinite plane to obtain characteristics of a radiation ratio A as shown in FIG. 2.

As clarified in FIG. 2, characteristics of the radiation ratio A are substantially the same with the radiation ratio at the frequency of about 800 MHz being maximum. However, the radiation ratio is reduced to halt the situation with the characteristic of a radiation ratio B or lower.

More specifically, as illustrated in FIG. 1B, the radiated emission caused upon the common mode resonance can be suppressed to half or lower by packaging the electronic components by the use of the printed-circuit board 10 in which the frame-shaped additional electric conductor 7 is electrically connected with the T-shaped pattern of the ground pattern 4 to close the recessed section 6 compared with the case where the electronic components are packaged on the printed-circuit board 1 that includes the ground pattern 4 composed of the simple T-shaped pattern as illustrated in FIG. 1A. The width size W of the frame-shaped additional electric conductor 7 electrically connected to the wide electric conductor pattern composed of the T-shaped pattern is set to 1/10 to 1/200 (in the present example 140 mm) of the size of the ground pattern 4 composed of the T-shaped pattern in the lateral direction Y, and is presented to an electromagnetic simulation. For a reduction effect of the radiated emission, the just-mentioned cases are substantially the same as a case where a rectangular electric conductor is added. A reason is that impedance in a resonance of an antenna is substantially not influenced by a thickness of an antenna wire.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 3:
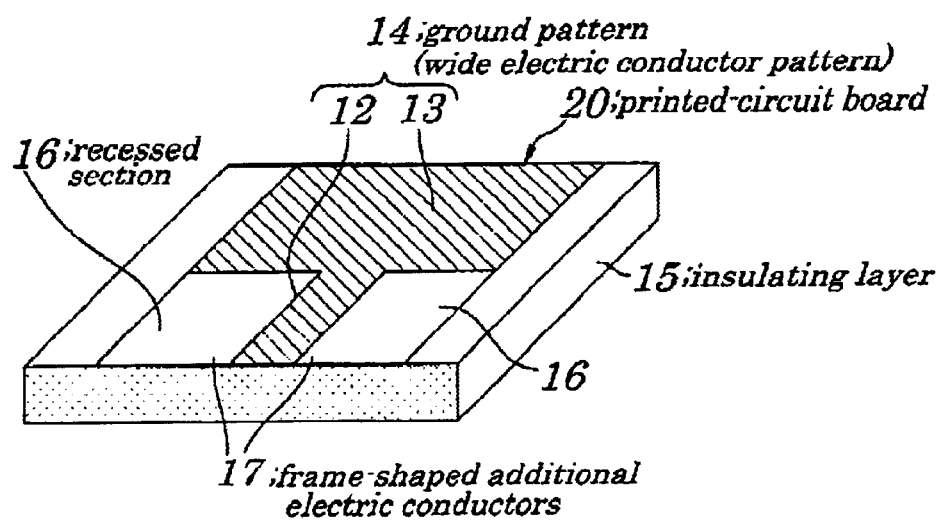
FIG. 3 is a perspective view illustrating a construction of the printed-circuit board according to a first embodiment of the present invention.

FIG. 3 is a perspective view illustrating a construction of the printed-circuit board according to a first embodiment of the present invention.

Figure 1A:
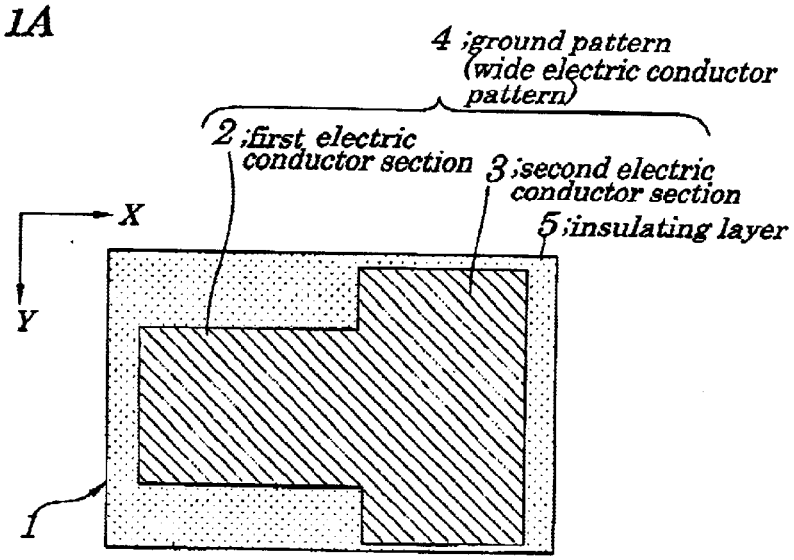
FIGS. 1A, 1B and 1C are views illustrating a principle of a printed-circuit board according to the present invention.
Figure 1B:
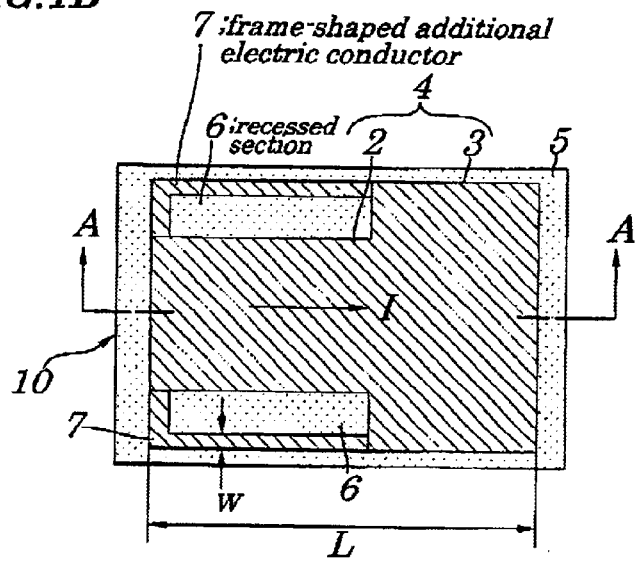
Figure 1C:
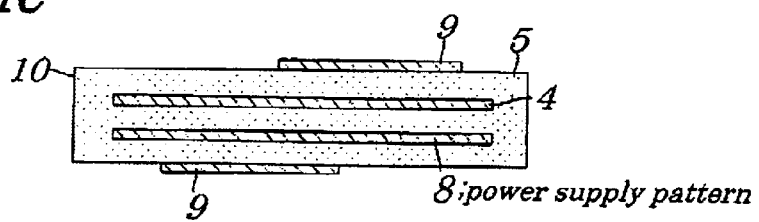
Figure 2:
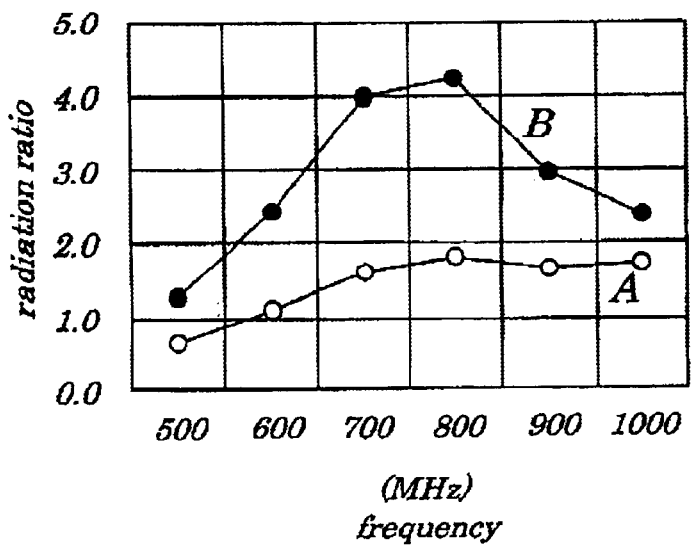
FIG. 2 is a view illustrating a relationship between a radiation ratio (vertical axis) and frequencies (horizontal axis) based upon the foregoing principle.

As shown in FIG. 3, a printed-circuit board 20 in the present embodiment is adapted such that a ground pattern 14 composed of a T-shaped pattern is formed on a surface of an insulating layer 15 constructed with an organic insulating board that comprises epoxy resin for example and an inorganic insulating board that comprises ceramics, or a like, to which T-shaped pattern frame-shaped additional electric conductors 17 are electrically connected so as to close a recessed section 16. The T-shaped pattern is formed with a first electric conductor section 12 of a rectangular wide electric conductor pattern and a second electric conductor section 13 of the rectangular wide electric conductor pattern substantially, both being integrally united, in a same fashion as the configuration illustrated in FIGS. 1A, 1B, and 1C.

The ground pattern 14 composed of the T-shaped pattern where the first electric conductor section 12 and the second electric conductor section 13 are united integrally, and the frame-shaped additional electric conductors 17 provided on the recessed section 16 of the T-shaped pattern are formed simultaneously on an entire surface of the insulating layer 15 by making use of metal such as Cu, Al, Fe, or a like, for example, and are patterned into desired shapes with the aid of processing means such as known photo-etching methods or a like. Further, substantially likewise the configuration illustrated in FIGS. 1A, 1B, and 1C, a power supply pattern (not shown) is formed in the insulating layer 15 to oppose the ground pattern 14, and a wiring pattern (signal line) is formed on a face and back of the insulating layer 15.

By electrically connecting the frame-shaped additional electric conductors 17 with the T-shaped pattern that constitutes the ground pattern 14 so as to close the recessed section 16 there is increased the width of an outer edge of the T-shaped pattern so as to surround the recessed section 16 with the frame-shaped additional electric conductor 17, so that as clarified from the foregoing experimental result when electric components are packaged on the present printed-circuit board 20, radiated emission generated upon a common mode resonance can be suppressed. This suppresses a common mode current to reduce an occurrence of EMI.

In addition, the formation of the frame-shaped additional electric conductor 17 is achieved simultaneously with the formation of the ground pattern 14 composed of the T-shaped pattern by making use of processing means such as a well known photo-etching after forming metal such as Cu, Al, Fe, or a like, over the entire surface of the insulating layer 15 as described previously, so that highly accurate patterning is simply realized. There is accordingly no conspicuous increase of a manufacturing cost. Further, the frame-shaped additional electric conductor 17 does not change its physical properties such as resistance with a passage of time, so that it is possible to achieve an operation of stably suppressing the common mode current.

In accordance with the printed-circuit board 20 in this example the frame-shaped additional electric conductors 17 are electrically connected to the T-shaped pattern that constitutes the ground pattern 14 so as to close the recessed section 16, whereby the width of the outer edge of the T-shaped pattern is increased so as to surround the frame-shaped additional electric conductors 17, and hence when electronic components are packaged on the printed-circuit board 20, the radiated emission can be suppressed.

The common mode current is suppressed stably without conspicuously increasing the manufacturing cost, and hence the occurrence of the EMI can be reduced.

Figure 4:
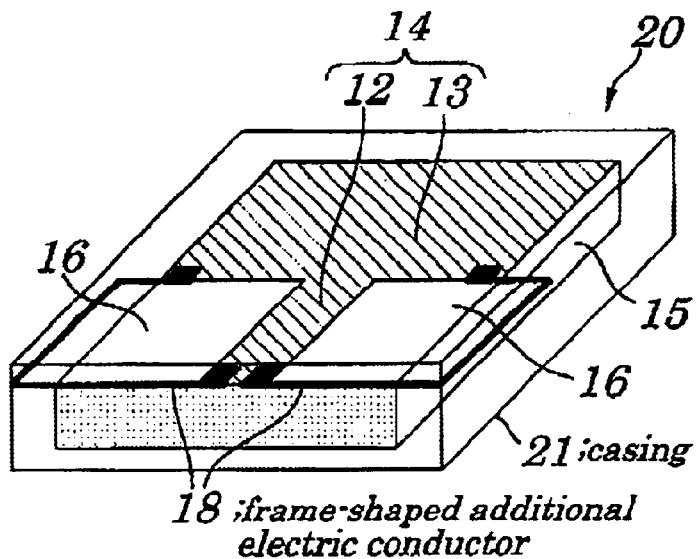
FIG. 4 is a perspective view illustrating a construction of a first modified example of the printed-circuit board according to the first embodiment of the present invention.

Referring to FIG. 4, the construction of a first modified example of the printed-circuit board 20 in the present example is illustrated in a perspective view. A sharp different point of the construction of a printed-circuit board 20 in the first modified example from that of the aforementioned first embodiment is that a frame-shaped additional electric conductor is formed using another electric conductor 18 from the ground pattern 14 composed of the T-shaped pattern.

More specifically, as shown in FIG. 4, the printed-circuit board 20 of the first modified example is adapted such that the ground pattern 14 composed of the T-shaped pattern is formed on the surface of the insulating layer 15, and the frame-shaped additional electric conductor 18 including a metal wire (not shown) that is another electric conductor is electrically connected by soldering for example so as to close the recessed section 16. In the present example, the metal wire is previously attached to a casing 21 of an electronic device in which the printed-circuit board 20 is assembled, and the printed-circuit board 20 is covered with the casing 21 and the metal wire is positioned to the ground pattern 14 for soldering. As the metal wire metal such as Cu, Al, Fe, or a like, for example may be employed.

It is noted that as the method for connecting the metal wire that is the frame-shaped additional electric conductor 18 to the ground pattern 14 use may be made of a conductive bonding agent instead of the aforementioned soldering or of welding or of screwing for the connection. In short, the metal wire may be electrically connected such that it acts as the frame-shaped additional electric conductor 18.

Also with the construction of the first modified example, substantially the same effect as that in the first embodiment is obtained.

Figure 5:
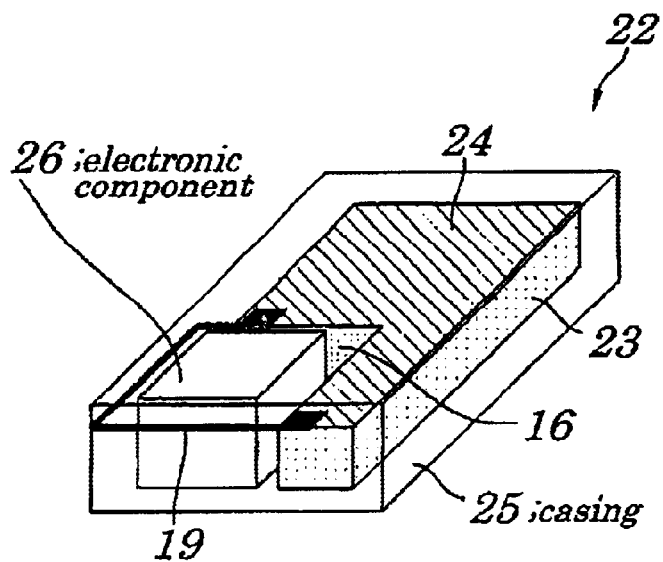
FIG. 5 is a perspective view illustrating a construction of a second modified example of the printed-circuit board according to the first embodiment of the present invention.

As shown in FIG. 5, a construction of a second modified example of a printed-circuit board 22 in the present example is illustrated in a perspective view. A sharp different point of the construction of the printed-circuit board 22 of the second modified example from the aforementioned first embodiment is that a ground pattern 24 composed of an L-shaped pattern is employed together with another electric conductor different from the ground pattern 24 to form a frame-shaped additional electric conductor 19.

More specifically, as shown in FIG. 5, the printed-circuit board 22 in the second modified example is adapted such that an insulating layer 23 composed of the L-shaped pattern is previously employed to form the ground pattern 24 composed of the T-shaped pattern on the surface of the insulating layer 23, and a frame-shaped additional electric conductor 19 composed of a metal wire that is another electric conductor is electrically connected with the T-shaped pattern of the ground pattern 24 by soldering for example so as to close the recessed section 16. Also in this example, in a same fashion as in the first modified example, a metal wire is previously attached to a casing 25 of an electronic device in which the printed-circuit board 22 is constructed, and the printed-circuit board 22 is covered with the casing 25, and the metal wire is positioned to the ground pattern 24 for soldering. The metal wire maybe made of Cu, Al, and Fe, or a like, for example. In a space of the recessed section 16 surrounded by the frame-shaped additional electric conductor 19 desired electronic components 26 are packaged. Further, as the method for connecting the metal wire that is the frame-shaped additional electric conductor 19 with the ground pattern 24 in the same fashion as in the first modified example use may be made of a conductive bonding agent or of welding or of screwing for achievement of the connection instead of the aforementioned soldering. In short, the metal wire may be electrically connected so as to act as the frame-shaped additional electric conductor 19.

Also with the construction of the present second modified example, substantially the same effect as in the first embodiment is obtained.

Second Embodiment

Figure 6:
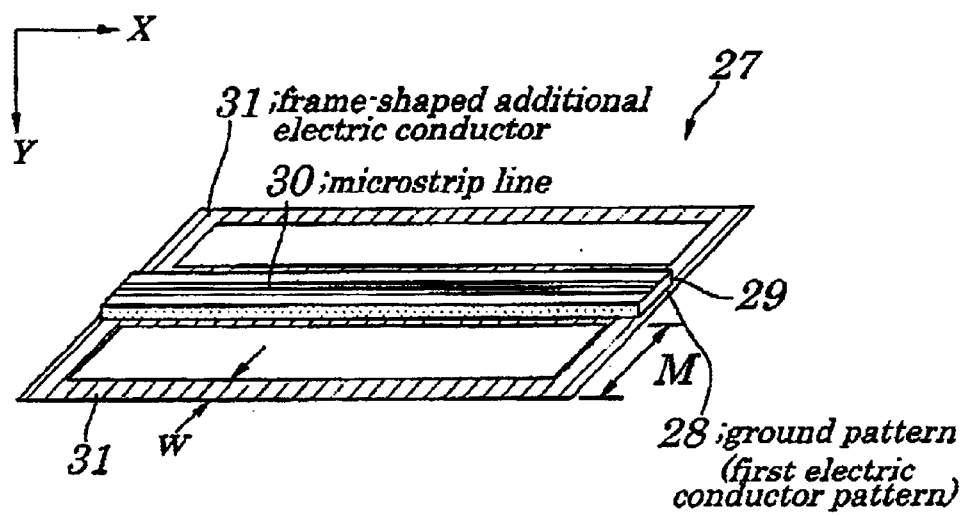
FIG. 6 is a view illustrating the construction of a printed-circuit board that is a second embodiment of the present invention.
Figure 7:
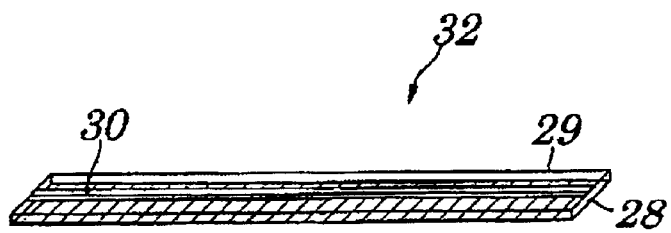
FIG. 7 is a perspective view illustrating a construction of a comparison example to the printed-circuit board.
Figure 8:
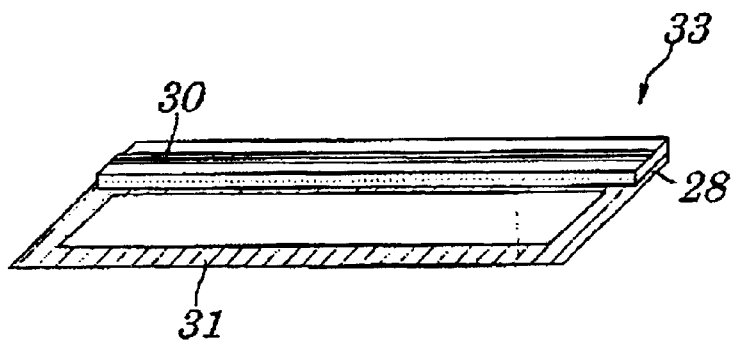
FIG. 8 is a perspective view illustrating a construction of a modified example of the printed-circuit board.
Figure 9:
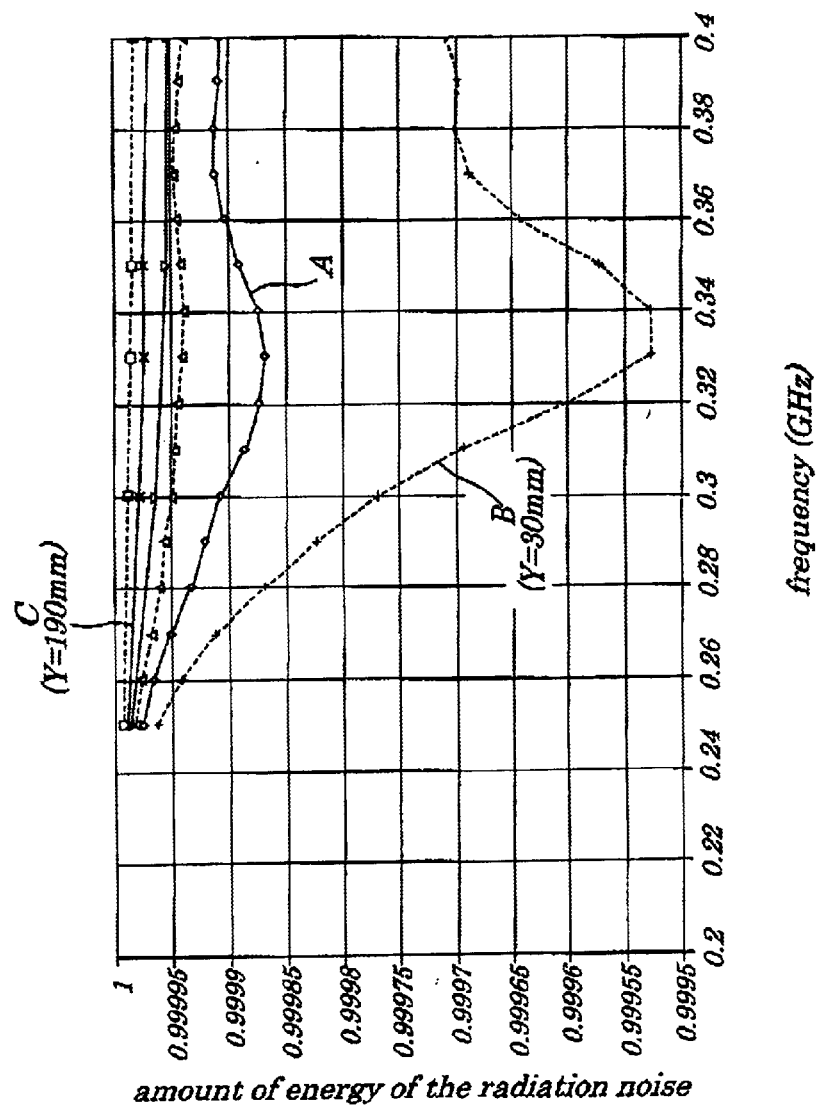
FIG. 9 is a view illustrating a relationship between the amount of energy (longitudinal axis) of radiated emission and frequencies (horizontal axis)

FIG. 6 is a view illustrating the construction of a printed-circuit board that is a second embodiment of the present invention; FIG. 7 is a perspective view illustrating a construction of a comparison example to the printed-circuit board; FIG. 8 is a perspective view illustrating a construction of a modified example of the printed-circuit board; and FIG. 9 is a view illustrating a relationship between the amount of energy (longitudinal axis) of radiated emission and frequencies (horizontal axis).

A sharp point of difference of the construction of the printed-circuit board 27 of the present second embodiment from that of the aforementioned first embodiment is that a micro strip line 30 is formed on a ground pattern 28 through an insulating layer 29.

More specifically, as shown in FIG. 6, the printed-circuit board 27 in the present example is adapted such that the micro-strip line 30 is formed on the ground pattern 28 composed of a rectangular elongated electric conductor pattern (first electric conductor pattern) with the size of 400 mm in a lateral direction X, with a size of 30 mm in a longitudinal direction Y, and with an aspect ratio of 13.3, and on both sides of the micro-strip line 30, a frame-shaped additional electric conductor 31 with a width size of 5 mm is electrically connected to the ground pattern 28.

In contrast, as shown in FIG. 7, the printed-circuit board 32 is illustrated as a comparison example, in which no frame-shaped additional electric conductor 31 is provided.

As shown in FIG. 9, a relationship between the amount of energy (vertical axis) of the radiated emission and frequencies (horizontal axis) is illustrated, in which the amount of energy of the radiated emission is more increased as a numerical value of the amount of energy of the radiated so emission is more decreased. The numerical value is desirable to approach 1 to an utmost. As illustrated in FIG. 9, a characteristic C demonstrates that corresponding to a comparison example in FIG. 7, in which the amount of energy of the radiated emission becomes maximum at a frequency of about 0.34 GHz. The reason that the amount of energy of radiated emission in the comparison example is increased is because the ground pattern 28 receives electromagnetic energy from the micro-strip line 30 and a common mode current flows to the ground pattern 28 to cause the radiated emission.

Provided here the size of the ground pattern 28 in the lateral direction X is set to 400 mm with an aspect ratio of 1, the radiated emission is further reduced, which means it is one occurring when the ground pattern 28 does not undergo the common mode resonance. It is contemplated that the amount of energy of the radiated emission when the size of the ground pattern 28 inn the lateral direction X is set to 400 mm is the amount of radiation energy of a wave source, and that the amount of energy of the radiated emission when the size of the ground pattern 28 in the horizontal direction X is twice the foregoing amount of the radiation energy of the wave source, and further that a difference therebetween is the amount of energy of the wave source.

Further, it is estimated from FIG. 9 (characteristic C) that the amount of the radiation energy of the wave source is substantially 1/50 of the amount of energy of the radiated emission when the ground pattern 28 is set to 30 mm in the size of the ground pattern in the longitudinal direction Y.

In accordance with the construction of the present example as illustrated in FIG. 6 it is possible to reduce, for the same reason as that in the first embodiment, the radiated emission caused in the common mode resonance by electrically connecting the frame-shaped additional electric conductor 31 with the ground pattern 28 on both sides of the micro-strip line 30. AS shown in FIG. 9, a characteristic A exhibits a characteristic when the size of the ground pattern in the longitudinal direction Y is set to 90 mm in the example in FIG. 6. The characteristic A exhibits that the amount of energy of the radiation energy at the frequency of about 0.34 GHz becomes maximum. The amount of energy just-mentioned above can be however reduced to about 1/6 of the characteristic C.

Referring again to FIG. 6, the radiated emission can be further reduced by extending more an outermost peripheral edge (size M) of the frame-shaped additional electric conductor 31 electrically connected with the ground pattern 28. The rate of the reduction is however substantially ½. It is effective to form the frame-shaped additional electric conductor 31 in which, as the aspect ratio of the outer peripheral edge of the ground pattern 28, the aspect ratio of the outer peripheral edge of the electric conductor having the size of 400 mm in the lateral direction X and the size of 90 mm in the longitudinal direction Y is reduced to about 4.4.

Also with the construction of the present example substantially the same effect as that in the first embodiment can be obtained.

As shown in FIG. 8, in which a modified example of the aforementioned example is illustrated, that is, a printed-circuit board 33 is illustrated which is adapted to electrically connect a frame-shaped additional electric conductor 31 to the ground pattern 28 on one side of the micro-strip line 30. Also with such construction the radiated emission occurring upon the common mode resonance can be reduced since the frame-shaped additional electric conductor 31 is electrically connected with the ground pattern 28.

In such a manner, also with the construction of the present modified example, substantially the same effect as that in the second embodiment can be obtained.

Third Embodiment

Figure 10:
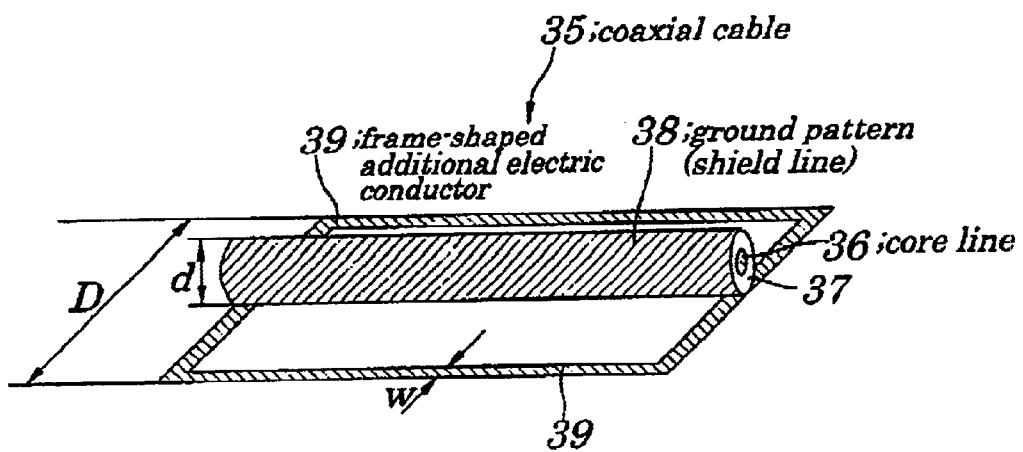
FIG. 10 is a perspective view illustrating a construction of a coaxial cable according to a third embodiment of the present invention.

FIG. 10 is a perspective view illustrating a construction of a coaxial cable according to a third embodiment of the present invention.

A sharp point of difference of the construction of the third embodiment from that of the foregoing first embodiment is that use is made of a coaxial cable instead of a printed-circuit board.

Referring again to FIG. 10, a coaxial cable 35 in the present example is adapted such that a ground pattern (shield line) 38 is formed around a core line 36 through an insulating layer 37, and a frame-shaped additional electric conductor 39 is electrically connected with both sides of the ground pattern 38.

It is confirmed as the result of simulation that provided a size D of an outer peripheral edge of the frame-shaped additional electric conductor 39 is set to be about six times of the diameter d of the coaxial cable, a radiated emission radiated in the common mode resonance of the coaxial cable can be reduced to about ⅓, compared with an example where no frame-shaped additional electric conductor 39 is provided. Further, the larger the size D of the outer peripheral edge of the frame-shaped additional electric conductor 39 is set, the more the radiated emission is radiated in the common mode resonance of the coaxial cable.

Also with the construction of the present example substantially the same effect as that in the first embodiment is achieved because of the printed-circuit board in the first example is being simply exchanged for the coaxial cable.

Figure 11:
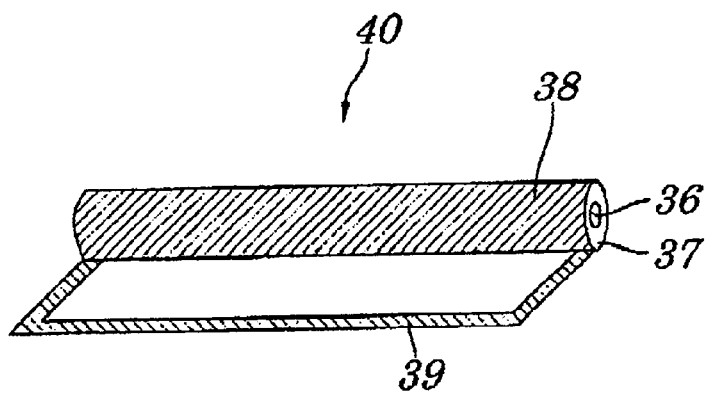
FIG. 11 is a perspective view illustrating a construction of a modified example of the foregoing coaxial cable.

Referring hereto FIG. 11, a modified example of a coaxial cable 40 of a third embodiment is illustrated in a perspective view. The modified example demonstrates the coaxial cable 40 adapted to electrically connect the frame-shaped additional electric conductor 39 to one side of the ground pattern 38. Also with the construction the radiated emission is reduced because the frame-shaped additional electric conductor 39 is electrically connected with the ground pattern 38.

Also with the construction of the present modified example substantially the same effect as that in the third embodiment is achieved.

Fourth Embodiment

Figure 12:
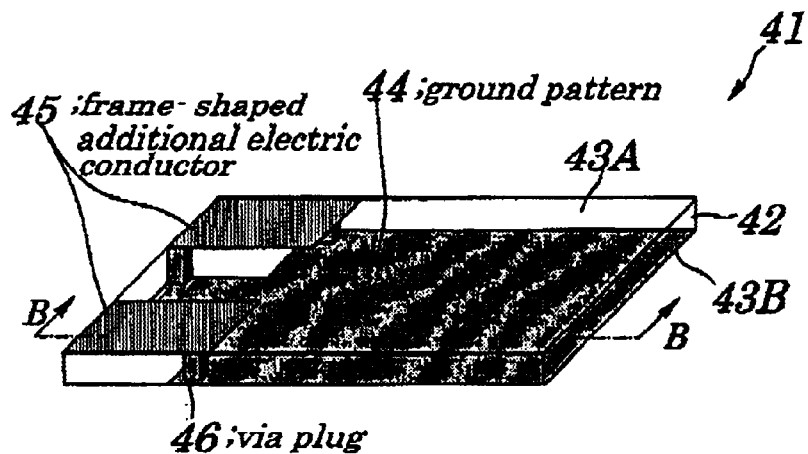
FIG. 12 is a perspective view illustrating a construction of a printed-circuit board according to a fourth embodiment of the present invention.
Figure 13:
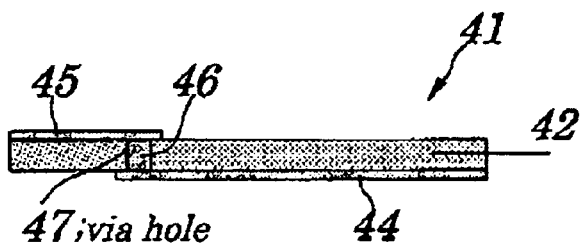
FIG. 13 is a cross-sectional view taken along arrows B—B in FIG. 12.
Figure 14:
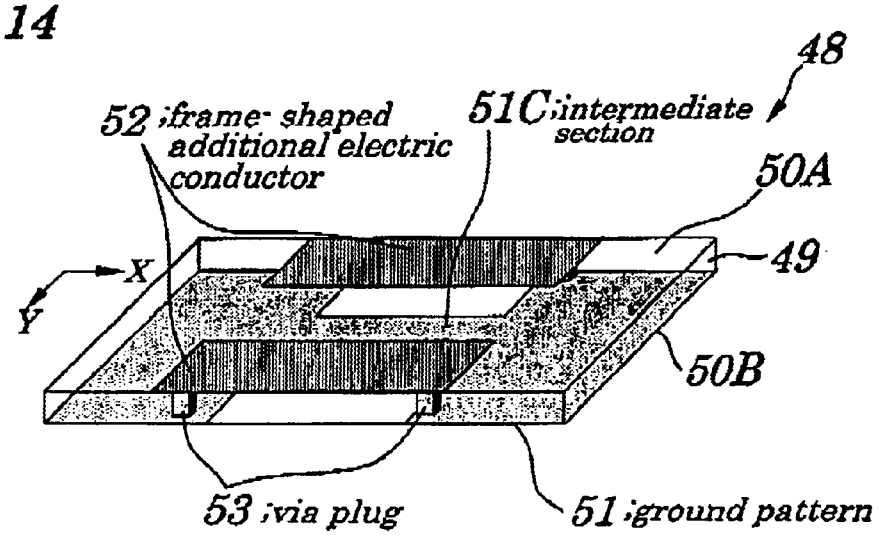
FIG. 14 is a perspective view illustrating a construction of a modified example of the printed-circuit board.

FIG. 12 is a perspective view for illustrating a construction of a printed-circuit board according to a fourth embodiment of the present invention; FIG. 13 is a cross-sectional view taken along arrows B—B in FIG. 12; and FIG. 14 is a perspective view illustrating a construction of a modified example of the printed-circuit board.

A sharp point of difference of the construction of the printed-circuit board of the present embodiment from that of the aforementioned first embodiment is that a ground pattern composed of a T-shaped pattern and a frame-shaped additional electric conductor are formed on different surfaces of an insulating layer.

More specifically, a printed-circuit board 41 in the present example is adapted as illustrated in FIGS. 12 and 13 such that a ground pattern 44 composed of a T-shaped pattern is previously formed on a back surface 43B of an insulating layer 42, and a frame-shaped additional electric conductor 45 is provided on a face surface 43A of the insulating layer 42 to electrically connect the ground pattern 44 and the frame-shaped additional electric conductor 45 through a via plug 46 formed on the insulating layer 42. In this case, the connection of the additional electric conductor 45 and the ground pattern 44 is achieved by forming the round pattern 44 on the back surface 43B of the insulating layer 42 with a printing technique, and connecting the via plug 46 to a ground pattern 44, and thereafter soldering the frame-shaped additional electric conductor 45 to the via plug 46. Further, the frame-shaped additional electric conductor 45 can be adapted such that a electric conductor pattern previously formed on an insulating film such as a polyimide film is formed, and is connected with the ground pattern 44 through a via hole 47 using a electric conductor bump.

In accordance with the present example, even though there is any limitation to the printed-circuit board in view of a space particularly when the framed-shaped additional electric conductor 45 is provided, the framed-shaped additional electric conductor 45 can be electrically connected simply to the ground pattern 44 by making use of the face surface 43A and back surface 43B of the insulating layer 42.

Also with the construction of the present fourth embodiment substantially the same effect as that in the first embodiment is achieved.

In addition, in accordance with the construction of the present example even though there is any limitation of the printed-circuit board in view of a space, an increase of an application region thereof is anticipated because the additional electric conductor is simply connected with the ground pattern.

A sharp point of difference of the construction of the printed-circuit board in the modified example in FIG. 14 from that inn the aforementioned fourth embodiment is that use is made of the ground pattern composed of an H-shaped pattern.

More specifically, the printed-circuit board 48 in the present modified example is adapted as illustrated in FIG. 14 such that a ground pattern 51 composed of the H shaped pattern is previously formed on a back surface 50B of an insulating layer 49, and in contrast a frame-shaped additional electric conductor 52 is provided on a face surface 50A of the insulating layer 49, and further the ground pattern 51 and the frame-shaped additional electric conductor 52 are electrically connected through a via plug 53 formed on the insulating layer 49. A size of the H-shaped pattern in a lateral direction X that constitutes the ground pattern 51 is set to 200 mm, and a size in a longitudinal direction Y is 95 mm, and further a size of an intermediate section 51C in the longitudinal direction Y is 45 mm, and furthermore a size from the via plug 53 to the end in the lateral direction X is set to 25 mm.

Figure 15:
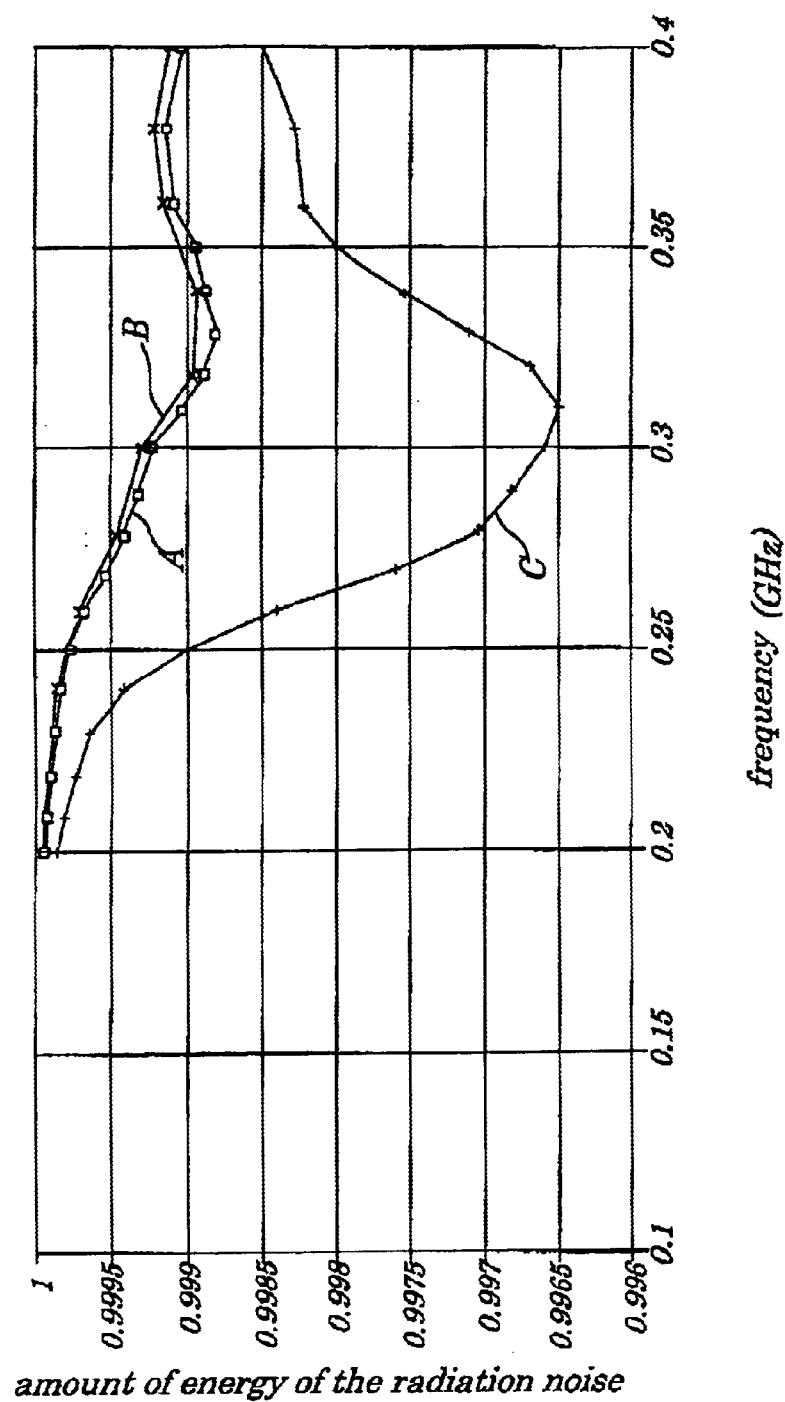
FIG. 15 is a view illustrating a relationship between the amount of energy of radiated emission (vertical axis) and frequencies (horizontal axis)

As shown in FIG. 15, a relationship between an amount of energy of radiated emission and frequencies (vertical axis) is illustrated. A characteristic C in the same figure exhibits one where no frame-shaped additional electric conductor 52 is provided in the modified example in FIG. 14. A characteristic B exhibits one corresponding to the modified example in FIG. 14, in which the size of a intermediate section 51C of the ground pattern 51 in the vertical direction Y is set twice.

Also with the construction of the modified example substantially the same effect as that in the fourth embodiment is achieved.

Fifth Embodiment

Figure 16A:
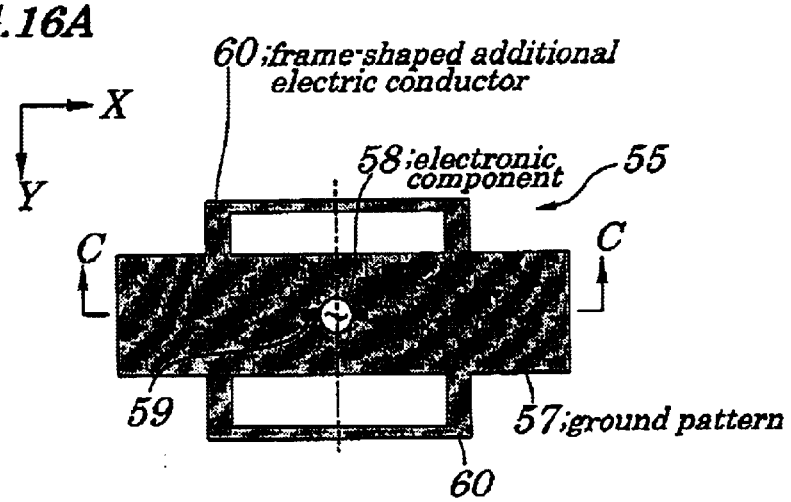
FIGS. 16A and 16B are views illustrating a construction of a printed-circuit board according to a fifth embodiment of the present invention.
Figure 16B:
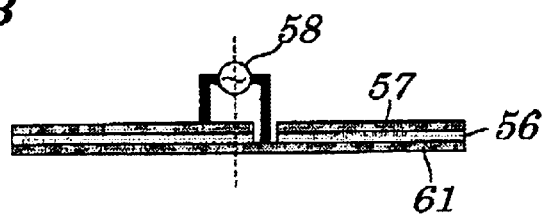

FIGS. 16A and 16B are views illustrating a construction of a printed-circuit board according to a fifth embodiment of the present invention, in which FIG. 16A is a plan view, and FIG. 16B is a cross sectional view taken along arrows C—C in FIG. 16A.

A sharp point of difference of the construction of a printed-circuit board in the first embodiment from that in the fifth embodiment is that a frame-shaped additional electric conductor is electrically connected to an outer peripheral edge of a side surface of electronic components in a ground pattern composed of a T-shaped pattern.

More specifically, a printed-circuit board 55 in the present example is adapted as illustrated in FIGS. 16A and 16B that a ground pattern 57 composed of a wide electric conductor pattern is previously formed on a surface of an insulating layer 56, and a frame-shaped additional electric conductor 60 is electrically connected to an outer peripheral edge of both side surfaces of the ground pattern 57 at a packaged position 59 of electronic components 58 so ads to surround the packaged position 59 of the electronic components 58. The framed-shaped additional electric conductor 60 may be connected by making use of soldering or a conductive bonding agent or welding or screwing. Further, a power supply pattern 61 is formed on the surface of the insulating layer 56 opposed to the ground pattern 57.

Figure 18:
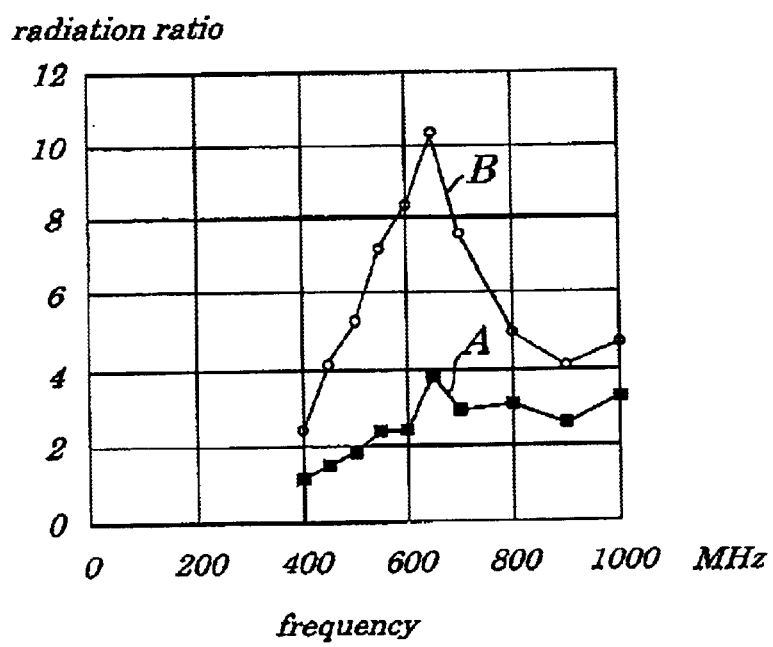
FIG. 18 is a view illustrating a relationship between a radiation ratio (longitudinal axis) and frequencies (horizontal axis)

As shown in FIG. 18, a relationship between a radiation ratio (vertical axis) and frequencies (horizontal axis) is illustrated. A simulation result is illustrated in the same figure in which a characteristic A is a result when a size of the ground pattern 57 on the printed-circuit board 55 in the present example in horizontal direction X is set to 200 mm, a size in the vertical axis Y 50 mm, and three sides of the frame-shaped additional electric conductor 60 are set to 100 mm. In contrast, a characteristic B exhibits a simulation result when no frame-shaped additional electric conductor 60 is provided.

The characteristics A and B exhibit a maximum radiation ratio at the frequencies of about 700 MHz, as clarified from FIG. 18. The radiation ratio of the characteristic A corresponding to the present example is reduced by about 60% compared with that of the characteristic B, so that in the present example the radiation ratio can be suppressed to half or less when compared with the prior art example.

Also with the construction of the fifth embodiment substantially the same effect as that in the first embodiment is achieved.

Figure 17A:
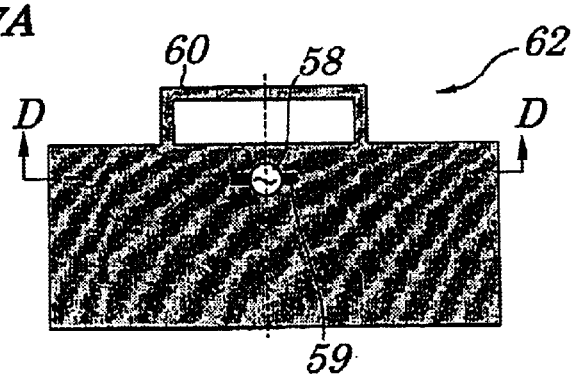
FIGS. 17A and 17B are views illustrating a construction of a modified example of the printed-circuit board.
Figure 17B:
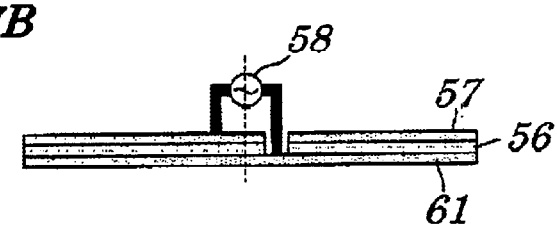

Referring further to FIGS. 17A and 17B, a construction of a modified example of the fifth embodiment is illustrated, in which FIG. 17A is a plan view and FIG. 17B is a cross sectional view taken along arrows D—D. A sharp pint of difference of the construction of the present modified example from that in the aforementioned fifth embodiment is that the frame-shaped additional electric conductor is electrically connected to one side of the ground pattern composed of the wide electric conductor pattern.

More specifically, a printed-circuit board 62 of the modified example is adapted as illustrated in FIGS. 17A and 17B such that the ground pattern 57 composed of the wide electric conductor pattern is previously formed on the surface of the insulating layer 56, and a frame-shaped additional electric conductor 60 is electrically connected with one side of the ground pattern 57 at the packaged position 59 of the electronic components 58.

Even with such a construction, radiated emission occurring in a common mode resonance can be reduced because the frame-shaped additional electric conductor 60 is provided on the ground pattern 57.

Also with the construction of the modified example substantially the same effect as that in the fifth embodiment is achieved.

Sixth Embodiment

Figure 19:
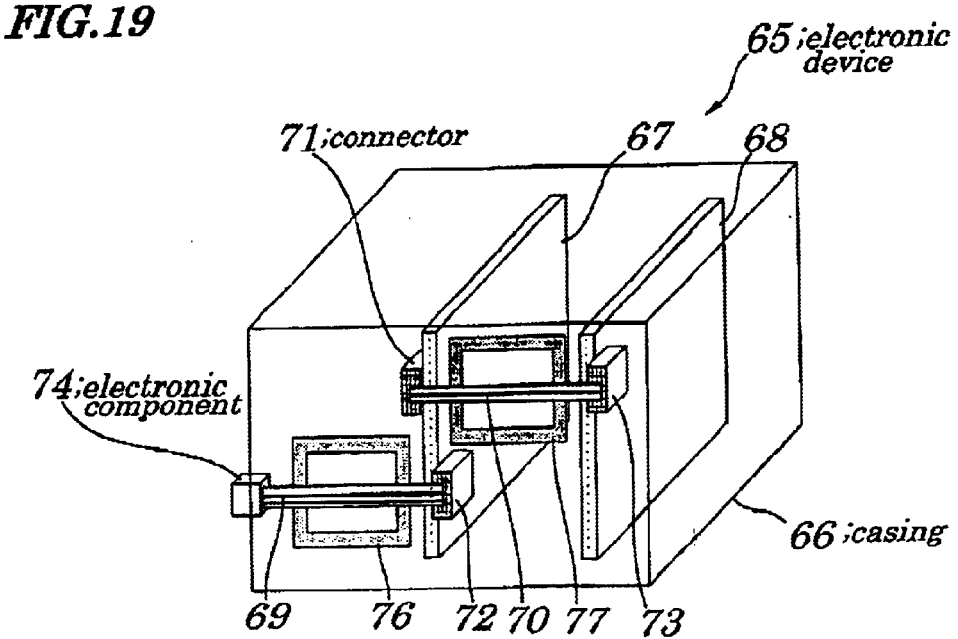
FIG. 19 is a perspective view illustrating a construction of an electronic device according to a sixth embodiment of the present invention.
Figure 20A:
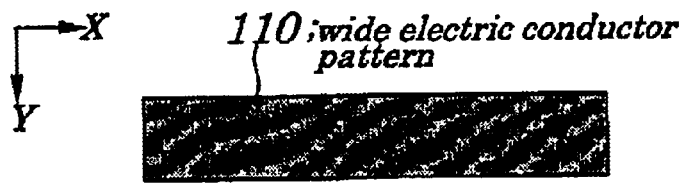
FIGS. 20A, 20B, and 20C are views exemplarily illustrating a electric conductor pattern in which a radiated emission is liable to be radiated upon a common mode resonance in a prior art.
Figure 20B:
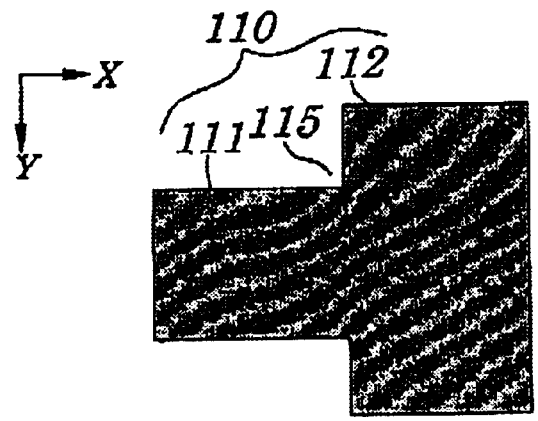
Figure 20C:
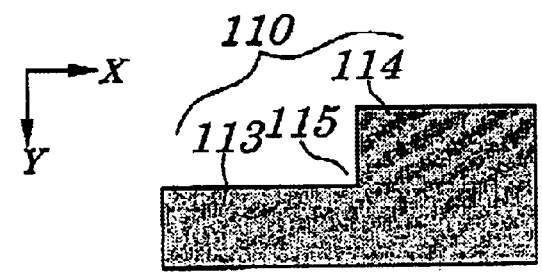
Figure 21A:
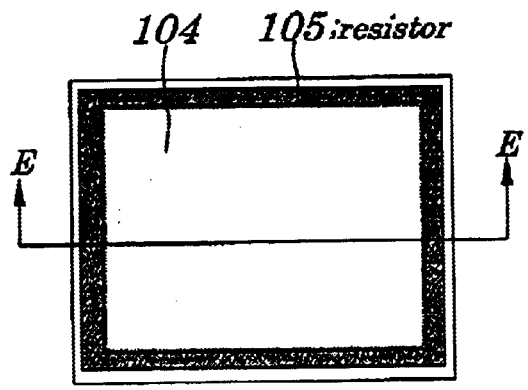
FIGS. 21A and 21B are views illustrating a construction of a prior art printed-circuit board.
Figure 21B:
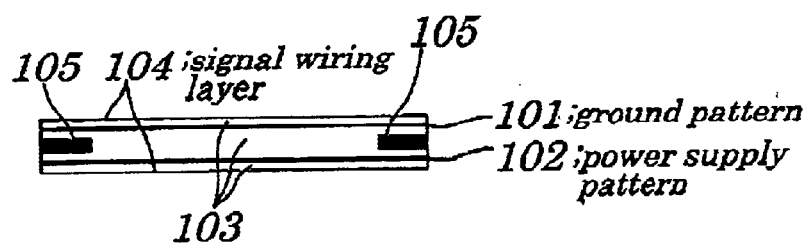

Referring to FIG. 19, a construction of an electronic device that is a sixth example of the present invention is illustrated in a perspective view. A sharp point of difference of the construction of the sixth embodiment from those of the first to sixth embodiments is that the electronic device is constructed in a combination of a printed-circuit board and a coaxial cable.

More specifically, an electronic device 65 in the present example is adapted as illustrated in FIG. 19 to combine two printed-circuit boards 67, 68, two coaxial cables 69, 70, and three connectors 71 to 73. Frame-shaped additional electric conductors 76, 77 are electrically connected with the printed-circuit boards 67, 68. Desired electronic components 74 are connected with a one terminal side of one coaxial cable 69. The electronic components 74 are adapted, arranged such that a line connecting a power supply source and a ground terminal extends perpendicularly to long sides of a electric conductor pattern such as a ground pattern.

When use is made of the coaxial cable or another cable a fine width ground pattern having an outer peripheral edge of a width substantially three times or more of that of a wiring area to each of these cables (printed-circuit board). Although the ground pattern is desirable to be electronically connected to a ground electric conductor of the cable, they may be brought into a close distance even though the connection is not achieved. Further, the ground pattern may be formed into a lattice pattern.

In accordance with the electronic device 65 in the present example, it can be operated without being influenced by radiated emission in a common mode resonance because it is assembled with the printed-circuit boards 67, 68 and the coaxial cables 69, 70 in a combination in which the radiated emission in the common mode resonance is reduced.

It is apparent that the present invention is not limited to the above embodiments but may be changed and modified without departing from the scope and spirit of the invention.

For example, although as the wide electric conductor pattern having a recessed section in part thereof the T-shaped pattern or the L-shaped pattern was exemplarily described, the present invention is not limited thereto, but is applicable also to another wide electric conductor pattern such as a U-shaped pattern or a V-shaped pattern.

When the electronic device is constructed by combining a plurality of printed-circuit boards or coaxial cables, any combination of those constructed in the respective embodiments is possible. An insulating layer that constitutes the printed-circuit board or the coaxial cable, insulating materials and electric conductor materials for use in the electric conductor pattern are not limited to those disclosed in the aforementioned respective embodiments, a choice is made of any materials.

What is claimed is:

1. A printed-circuit board, comprising:
   an insulating layer;
   a wide electric conductor pattern formed into a plane configuration having a recessed section in part so as to make up a ground pattern or a power supply pattern on said insulating layer; and
   an additional electric conductor electrically connected with said wide electric conductor pattern so as to close said recessed section.

2. The printed-circuit board according to claim 1, wherein said wide electric conductor pattern comprises a T-shaped pattern, an L-shaped pattern, or an H-shaped pattern.

3. The printed-circuit board according to claim 1, wherein said wide electric conductor pattern and said additional electric conductor are formed on different surfaces of said insulating layer respectively.

4. The printed-circuit board according to claim 3, wherein said wide electric conductor pattern and said additional electric conductor are electrically connected with each other through a via plug formed on said insulating layer.

5. The printed-circuit board according to claim 1, wherein said additional electric conductor is electrically connected with a side surface of electronic components of said wide electric conductor pattern at a position of packaging of said electronic components.

6. The printed-circuit board according to claim 1, wherein said additional electric conductor is electrically connected with a side surface of said wide electric conductor pattern on at least one side of said wide electric conductor pattern in a longitudinal direction of said wide electric conductor pattern.

7. The printed-circuit board according to claim 1, wherein said additional electric conductor is formed on said insulating layer simultaneously with said wide electric conductor pattern.

8. A printed-circuit board, comprising:
   an insulating layer;
   a wide electric conductor pattern making up a ground pattern or a power supply pattern;
   a micro-strip line formed through said insulating layer on said wide conductor pattern; and
   an additional electric conductor electrically connected with said wide electric conductor pattern on a side surface of at least one side of said micro-strip line.

9. A coaxial cable, comprising:
   an insulating layer;
   a core line;
   a shield line formed around said core line through said insulating layer; and
   an additional electric conductor electrically connected to at least one side in a length direction of said shield line, wherein said additional electric conductor comprises a frame-shaped electrical conductor.

10. A coaxial cable, comprising:
    an insulating layer;
    a core line;
    a shield line formed around said core line through said insulating layer; and
    an additional electric conductor electrically connected to at least one side in a length direction of said shield line, wherein a longitudinal size D of an outer peripheral edge of said additional electric conductor and a diameter d of said coaxial cable are set to satisfy a relationship: $D=6d$.

11. An electronic device, comprising:
    a printed-circuit board comprising:
      an insulating layer;
      a wide electric conductor pattern formed into a plane configuration having a recessed section in part so as to make up a ground pattern or a power supply pattern on said insulating layer; and
      an additional electric conductor electrically connected with said wide electric conductor pattern so as to close said recessed section; and
    a coaxial cable comprising:
      an insulating layer;
      a core line; and
      a shield line formed around said core line through said insulating layer,
        wherein said additional electric conductor electrically connected to at least one side in the length direction of said shield line.

12. The electronic device according to claim 11, wherein a fine width ground pattern is connected with said printed-circuit board, said ground pattern comprising an outer peripheral edge of a width substantially three times or more the width of a wiring area.

13. The electronic device according to claim 11, wherein said wide electric conductor pattern comprises a T-shaped pattern, an L-shaped pattern, or an H-shaped pattern.

14. The electronic device according to claim 11, wherein said wide electric conductor pattern and said additional electric conductor are formed on different surfaces of said insulating layer respectively.

15. The electronic device according to claim 14, wherein said wide electric conductor pattern and said additional electric conductor are electrically connected with each other through a via plug formed on said insulating layer.

16. The electronic device according to claim 11, wherein said additional electric conductor is electrically connected with a side surface of electronic components of said wide electric conductor pattern at a position of packaging of said electronic components.

17. The electronic device according to claim 11, wherein said additional electric conductor is electrically connected with a side surface of said wide electric conductor pattern on at least one side of said wide electric conductor pattern in a longitudinal direction of said wide electric conductor pattern.

18. The electronic device according to claim 11, wherein said additional electric conductor is formed on said insulating layer simultaneously with said wide electric conductor pattern.

19. An electronic device, comprising:
   a printed-circuit board comprising:
      an insulating layer;
      a wide electric conductor pattern making up a ground pattern or a power supply pattern;
      a micro-strip line formed through said insulating layer on said wide conductor pattern; and
      an additional electric conductor electrically connected with said wide electric conductor pattern on a side surface of at least one side of said micro-strip line; and
   a coaxial cable comprising:
      an insulating layer;
      a core line; and
      a shield line formed around said core line through said insulating layer,
         wherein said additional electric conductor electrically connected to at least one side in the length direction of said shield line.

20. The electronic device according to claim 19, wherein a fine width ground pattern is connected with said printed-circuit board, said ground pattern comprising an outer peripheral edge of a width substantially three times or more the width of a wiring area.

21. The electronic device according to claim 19, wherein a longitudinal size D of an outer peripheral edge of said additional electric conductor and a diameter d of said coaxial cable are set to satisfy a relationship: D=6d.

22. An electronic device in which at least one electronic component is mounted on a printed-circuit board, wherein a planar wide electric conductor pattern making up a ground pattern or a power supply pattern is formed, the electronic device comprising:
   an additional electric conductor electrically connected with an outer peripheral edge of said wide electric conductor pattern of a side surface of said at least one electronic components so as to surround a mourned position of said at least one electronic component.

23. The coaxial cable according to claim 9, wherein a size of an outer peripheral edge of said additional electric conductor is set larger than a diameter of said coaxial cable.

* * * * *